United States Patent [19]

Sander et al.

[11] Patent Number: 4,912,540
[45] Date of Patent: Mar. 27, 1990

[54] REDUCED AREA BUTTING CONTACT STRUCTURE

[75] Inventors: Craig S. Sander; Richard K. Klein, both of Mountain View; Tat C. Choi, Milpitas, all of Calif.

[73] Assignee: Advanced Micro Devices, Inc., Sunnyvale, Calif.

[21] Appl. No.: 230,696

[22] Filed: Aug. 5, 1988

Related U.S. Application Data

[63] Continuation of Ser. No. 944,150, Dec. 16, 1986, abandoned.

[51] Int. Cl.⁴ ............... H01L 29/04; H01L 23/48; H01L 29/34
[52] U.S. Cl. ................................ 357/59; 357/54; 357/71
[58] Field of Search ......................... 357/54, 59, 71

[56] References Cited

U.S. PATENT DOCUMENTS

| | | | |
|---|---|---|---|
| 3,808,470 | 4/1974 | Kniepkamp | 357/71 |
| 4,358,326 | 11/1982 | Doo | 357/59 |
| 4,663,831 | 5/1987 | Birrittella et al. | 357/71 |

FOREIGN PATENT DOCUMENTS

| | | | |
|---|---|---|---|
| 58-213449 | 12/1983 | Japan | 357/71 |
| 58-215055 | 12/1983 | Japan | 357/71 |
| 60-79744 | 5/1985 | Japan | 357/71 |

Primary Examiner—Gene M. Munson
Attorney, Agent, or Firm—Ashen Golant Martin & Selden

[57] ABSTRACT

A reduced area butting contact structure (10') is provided, which is especially suited for four-transistor static RAM cells. A structure is formed which includes a doped silicon region and one or more layers of polysilicon and oxide situated thereabove, one of which layers of polysilicon may be a gate polysilicon. An anisotropic etch is then performed through all upper layers including any upper polysilicon layers which may be present, but stopping at the doped silicon region and any gate polysilicon layers present, to form a contact hole (26'). The contact hole is filled with a conductive plug (32) of a material such as tungsten or polysilicon and etched back. In either case, contact with all polysilicon layers present and the doped silicon region is made. In the anisotropic etching process, a two-step etch is employed. The first etch is non-specific as to material, etching all relevant materials (polysilicon and oxide) at substantially the same rate and is continued through any upper polysilicon layers, but is terminated prior to etching the doped silicon region or any gate polysilicon layers (22). The second etch is specific as to material, etching silicon dioxide faster than polysilicon or silicon, and thus stops at the gate polysilicon layer and the doped silicon region.

33 Claims, 2 Drawing Sheets

REDUCED AREA BUTTING CONTACT STRUCTURE

This is a continuation of co-pending application Ser. No. 06/944,150 filed on December 16, 1986, now abandoned.

CROSS-REFERENCE TO RELATED APPLICATION

The present application is related to application Ser. No. 280,782, filed on December 7, 1988 and assigned to the same assignee of the present application, which is a continuation of Ser. No. 8215, filed on January 28, 1987, now abandoned. The related application is directed to a reduced-area, four-transistor static RAM cell having a symmetrical layout and only two butting contacts. The butting contacts disclosed and claimed in the present application are utilized in the related application to further reduce the cell layout area.

BACKGROUND OF THE INVENTION

1. Field of the Invention

The present invention relates to butting contact structures, and, more particularly, to reducing the area of butting contact structures such as those employed in static random access memory (RAM) cells.

2. Description of the Related Art

Butting contact structures form an electrical connection between doped regions in a silicon layer and one or more polysilicon layers. They are especially useful in four-transistor static RAM cells where an electrical connection is required between layers of polysilicon and the doped silicon region.

In the conventional four-transistor static RAM cell, a butting contact is made by patterning a gate polysilicon layer (gate poly) with an underlying gate oxide lying over a doped silicon region and covering the entire region, including the gate poly, with an oxide, such as silicon dioxide. A contact hole is then etched in the oxide exposing portions of both the gate poly and the doped silicon region. This particular contact hole, usually referred to as a quasi-buried contact, is distinct from the contact hole used to connect a first metal layer to underlying layers.

A polysilicon layer, called the load poly, is then deposited on top of the exposed portions of both the gate poly and the doped silicon region. This poly layer is then patterned and selectively doped in the vicinity of the contact hole to make electrical contact to and between the gate poly and the doped silicon region.

This contact structure requires a large layout area because the load poly must cover the contact hole entirely even under the worst-case conditions of misalignment and other process variations. If the contact hole is not completely covered by the load poly, then either a portion of the doped silicon region or the gate poly may be etched away when the load poly is defined and etched, which can lead to improper operation of the memory cell.

SUMMARY OF THE INVENTION

Accordingly, it is an object of the present invention to provide electrical connection of one or more layers of polysilicon to a doped silicon region.

It is another object of the present invention to provide such electrical connection in as small an area as possible.

It is yet another object of the present invention to provide in a four-transistor static RAM cell a butting contact permitting reduced layout area that also provides electrical connection of one or more layers of polysilicon to the doped silicon region.

Briefly, in accordance with the invention, a reduced area butting contact structure for an integrated circuit, especially four-transistor static RAM cells, is provided. The contact structure interconnects by means of a conductive plug a doped region of a semiconductor material with at least one polysilicon segment, which may be a first-layer, or gate, polysilicon segment and/or an upper-layer polysilicon segment, including a load polysilicon segment.

The gate polysilicon, if present, is separated from the doped region by a thin oxide layer. Any upper-layer polysilicon segments, if present, are each positioned between and bordered above and below by upper layers of insulating material.

The conductive plug comprises a conductive material confined in and substantially filling a contact hole, which is positioned over a portion of the doped region and a portion of the first-layer polysilicon segment and portions of the upper-layer polysilicon segments.

The contact hole extends from the surface of the uppermost upper layer of insulating material through the portions of the upper-layer polysilicon segments which are contacted and the upper layers of insulating material down to and terminating on the portion of the first-layer polysilicon segment and the portion of the doped region.

In the process of the invention, the contact hole is formed by using an anisotropic to etch through all upper layers, stopping at the doped region and/or gate poly layer. The contact hole is then filled by a conductive plug comprising a material such as tungsten or polysilicon. Thus, electrical contact with all silicon layers present and the doped silicon region may be made.

In the anisotropic etching process, a two-step etch is employed. The first etch is non-specific as to material, etching all relevant materials (polysilicon and oxide) at substantially the same rate and is continued past any upper polysilicon layers, but is terminated prior to etching any gate polysilicon layers or the doped silicon region.

The second etch is specific as to material, etching silicon dioxide faster than polysilicon or silicon, and thus does not substantially etch the doped silicon region or the gate polysilicon layer.

The contact of the invention may be used to connect one, two, or several layers of polysilicon with the doped silicon region. The contact significantly reduces layout area of butting contacts between the doped silicon region and one or more layers of polysilicon. This in turn allows a significant reduction in the size of a four-transistor static RAM cell, which results in a cost advantage due to smaller die size.

Other objects, features and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

DETAILED DESCRIPTION OF THE INVENTION

Figure 1:
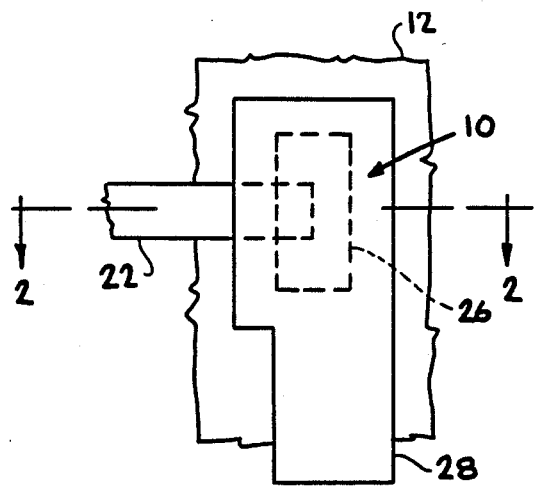
FIG. 1 is a top plan view of a conventional butting contact in a four-transistor static RAM cell.
Figure 2:
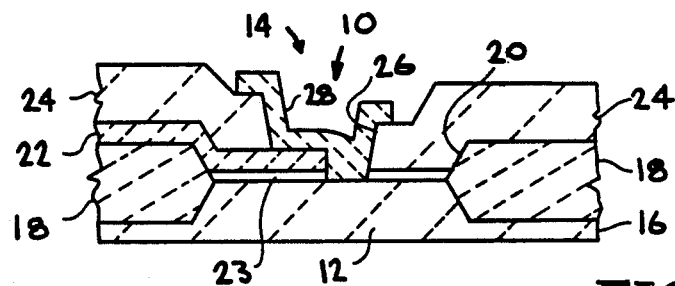
FIG. 2 is a cross-sectional view taken along the line 2—2 of FIG. 1.

The traditional way of making a butting contact, shown generally at 10, in a four-transistor static RAM cell is depicted in FIGS. 1 and 2. There, a doped region 12 is formed in a portion of a semiconductor substrate 16, surrounded by a field region defined by a field oxide 18. The doped region 12 is typically formed by diffusion, although other techniques, such as ion implantation, may also be employed. Silicon-based technology is commonly employed at the present time to form such memory cells.

A polysilicon layer 22, which is an extension of a connection to a gate (not shown) in another part of the substrate, overlies a thin oxide layer 23. The thin oxide layer 23, which is typically less than about 1,000 Å thick, and usually less than about 500 Å thick, is formed during the formation of the gate oxide employed in the gate (not shown), and accordingly is called the gate oxide, although it serves no such function at the contact area 10. Similarly, the polysilicon layer 22 is referred to as the gate poly.

The gate poly 22 overlying the doped silicon region 12 is patterned and is covered with an oxide 24. A contact hole 26 is then etched in the oxide 24, exposing portions of both the gate poly 22 and the doped silicon region 12.

A polysilicon layer 28, called the load poly, is then deposited on top of both the gate poly 22 and the doped silicon region 12 so as to overlap the contact hole 26 and is patterned. This overlap must be sufficient to ensure complete contact hole 26 coverage even under the worst conditions of misalignment and other process variations. Portions of the polysilicon layer 28 are appropriately doped to provide both a resistive load and an ohmic contact. It will be seen in FIG. 2 that the load poly 28 provides electrical connection between the load poly, the gate poly 22 and the doped region 12.

Reference is now made in detail to a specific embodiment of the present invention, which illustrates the best mode presently contemplated by the inventors for practicing the invention. Alternative embodiments are also briefly described as applicable. Although the discussion is presented specifically with regard to silicon-based technology, it will be appreciated that other semiconductor materials and the corresponding insulating materials may be employed in the practice of the invention.

The novel structure of the invention utilizes a conductive plug which is self-aligned to the contact hole to form an electrical connection between a doped silicon region and one or more layers of polysilicon. This structure does not require a separate contact hole which is distinct from the contact hole used for electrical connection between the first metal and underlying conductive layers. Using this approach, contact to the load poly is made at an edge of the load poly and area is saved because it is not necessary to have the load poly overlay the edge of the contact hole.

Figure 3:
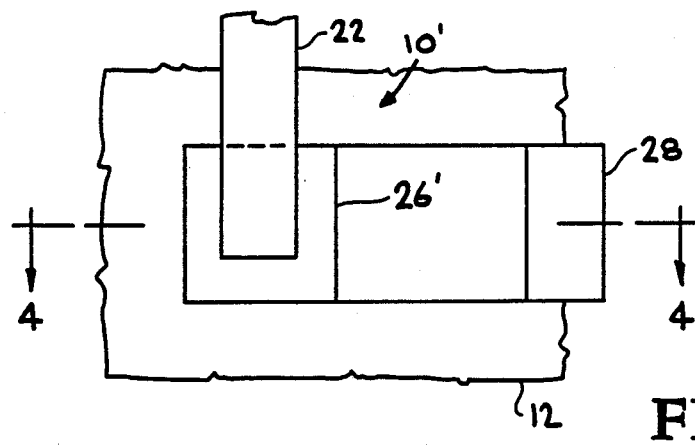
FIG. 3 is a top plan view of the novel butting contact of the invention.

In the process of the invention, a preferred contact etch is utilized in order to fabricate the reduced area contact 10'. To illustrate, reference is now made to FIG. 3, which depicts the layout of the novel butting contact 10' of the invention.

As seen therein, the load poly 28 is not required to overlap the contact hole 26'. In fact, the only requirement is that the contact 10' touches the load poly 28 under worst-case conditions of misalignment. The contact 10' is made in the following manner, referring now to FIGS. 4a–d.

Figure 4A:
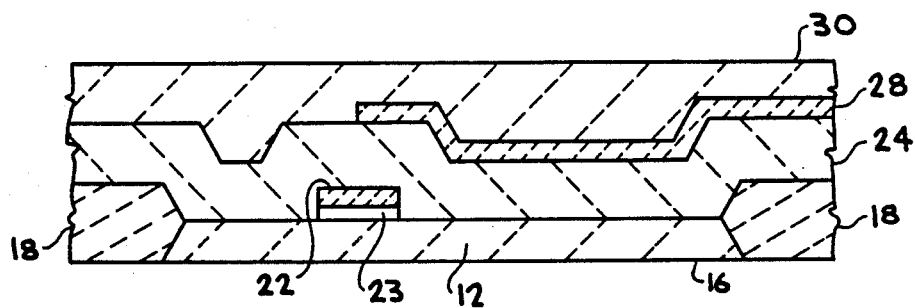
FIGS. 4a–d depict, in cross-sectional view, taken along the line 4—4 of FIG. 3, the sequence of processing to form the novel butting contact of the invention.

After the polysilicon layers 22, 28 have been deposited and defined over the doped silicon region 12, an oxide 30, such as silicon dioxide, is formed over the entire surface and fully planarized, as seen in FIG. 4a. The planarization process is well-known and does not form a part of this invention.

A contact hole 26' is defined and etched so as to overlap portions of the load poly 28, the gate poly 22 and the doped silicon region 12. Where both a gate poly 22 and at least one load poly 28 are present, this contact etch is performed using a two-step process.

Figure 4B:
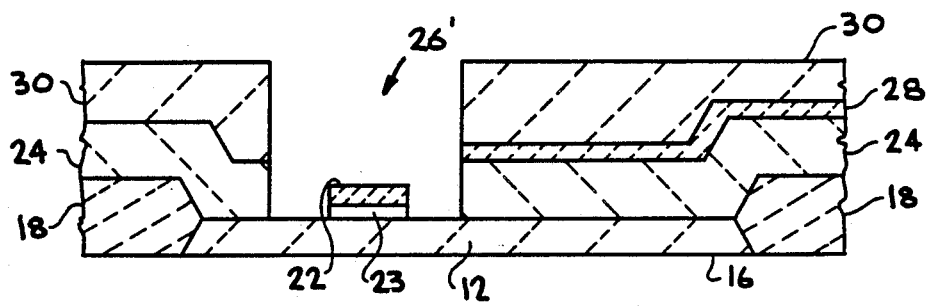

The first step etches polysilicon and oxide at approximately the same rate. This step is carried out until the etch has gone through the load poly 28, and then the etch is switched to a conventional oxide etch which has a high selectivity to silicon and polysilicon. Consequently, the selective etch etches through the oxide layer 24, but stops at the doped silicon region 12 and gate poly 22. Where the gate poly 22 is absent, the selective etch stops at the doped silicon region 12. The resulting structure is shown in FIG. 4b.

An important condition is that the etch must be anisotropic so that the contact walls 26' are near-vertical. Some slope of the walls, causing the dimension of the top of the contact to be larger than the bottom, is acceptable. In typical applications, the dimension of the top of the contact should not exceed the dimension of the bottom by more than approximately 30%.

It is also important to ensure that the load poly 28 is not substantially recessed relative to the oxide portion of the contact walls. Typically, the undercut of the load poly 28 should be limited such that the edge of the load poly is recessed from the oxide contact wall by no more than approximately 50% of the thickness of the load poly layer.

A variety of etch processes for creating the structure described above are well-known to those skilled in the art. One suitable example employs reactive ion etching (RIE), using $CHF_3$ and $O_2$ chemistry. By varying the relative amounts of $CHF_3$ and $O_2$, it is possible to obtain oxide-to-silicon etch ratios ranging between 0.5 and 20. The relative amounts of these gases should be adjusted for the first step of the etch to produce an etch ratio as close to 1.0 as possible, with values between about 0.75 and 1.5 being generally acceptable. The second step of the etch should be carried out with an etch gas ratio that causes oxide to be etched at a much greater rate than silicon or polysilicon. With this ratio, the etch can be terminated on, without substantially etching, polysilicon or doped silicon regions. An oxide-to-silicon etch ratio greater than about 10 is generally acceptable for the second step of the etch.

The conversion from the first to the second step of the etch should not be carried out until it is certain that etching through the load poly layer 28 or the lowest of additional polysilicon layers other than the gate poly has been completed. This conversion point may be determined by at least two methods. The first method involves timing the etch with knowledge of the relevant etch rates and material thicknesses. Another method utilizes optical or electronic detection of residual etch gases to signal that the polysilicon layer 28 has been completely etched. Of course, if there is more than one polysilicon layer (not including the gate poly layer 22) to be etched through, appropriate adjustments must be made in the above methods.

In some applications, there may be no load poly layer 28 present. In such a case, then only the second etch step, which terminates at the surface of the gate poly 22 and the surface of the doped silicon region 12, is employed.

The thickness of the oxide 24 between the load poly 28 and the gate poly 22 must be thick enough to compensate for non-uniformities in both the oxide deposition itself and the first part of the etch cycle. The oxide layer 24 should be thick enough to ensure that on the fastest-etching wafers, the first part of the contact etch does not reach the gate poly 22 or the doped silicon region 12 before the load poly 28 is completely etched through the slowest-etching wafers.

Figure 4C:
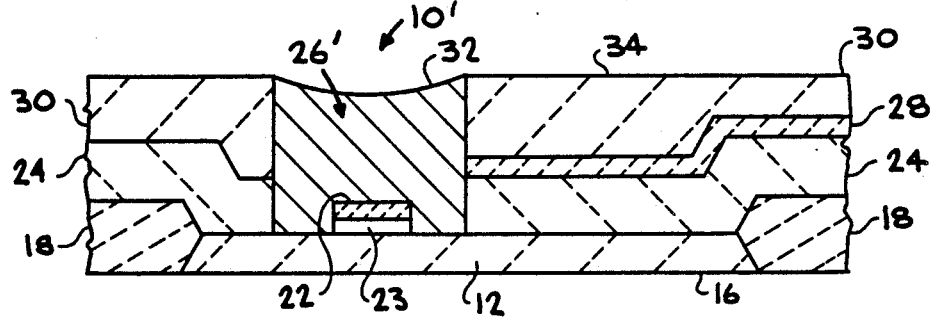

After the contact hole 26' shown in FIG. 4b has been created by etching, a conductive plug 32 which substantially fills and is confined within the contact hole 26' is formed. One method to create this plug 32 is to conformally deposit a conductive material to fill the contact hole 26' and then etch back this material substantially flush to surface 34 of the oxide 30. Examples of such materials include tungsten and doped polysilicon.

Where a doped polysilicon plug 32 is employed and where the underlying doped silicon region 12 and poly gate 22 are doped with an N-type dopant, the plug 32 is then doped N+, such as by a $POCl_3$ pre-deposition and drive. Where the underlying doped silicon region and polysilicon layers are doped with a P-type dopant, the plug 32 is alternatively doped P+, such as by ion implantation of $^{11}B$ or $BF_2$. Finally, in situ-doped polysilicon may also be employed in fabricating the plug 32. The resulting structure is shown in FIG. 4c.

It will be seen that the plug 32 electrically connects the load poly (upper-layer polysilicon segment) 28 and the gate poly (first-layer polysilicon segment) 22 with the doped silicon region 12. Of course, more than one upper-layer polysilicon segment 28 may be present. Also, either the load poly layer 28 or the gate poly 22 may be absent. The reduced area contact 10' of the invention contemplates all such variations.

It should be noted that no added contact mask is require for the novel butting contact of the invention, as the conventional first contact mask may be employed. The only provision is that all contacts to the load poly 28, even those which do not form butting contacts, require an isolated pad of gate poly 22 or doped silicon region 12 underneath them to act as an etch stop for the contact etch.

Figure 4D:
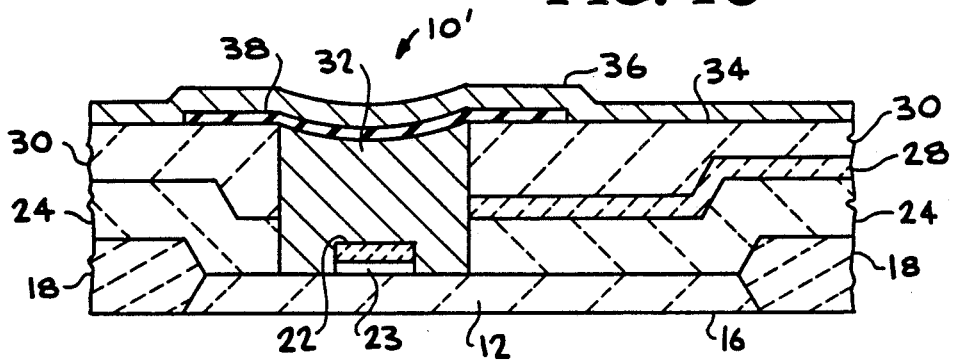

Using the structure as described above would require any metal interconnects 36 to be routed around the butting contact 10', or else the contact would be shorted to the metal. An optional feature which may be used to further increase layout efficiency is an insulating plug cover 38 as shown in FIG. 4d. This cover 38 may be formed by depositing an insulating layer such as $SiO_2$ and then using a non-critical masking step and wet etch to remove this insulator over other contact areas. It is preferable for selectivity purposes that this insulator have a higher etch rate than that of the underlying oxide.

Such a differential etch rate is achieved for two layers of silicon dioxide 30, 38 due to densification of the lower oxide 30 by heat treatment at elevated temperatures greater than about 600° C. The densified oxide 30 etches more slowly than non-densified oxide 38.

Alternatively, the upper oxide layer 38 could be doped, say to about 4 to 8%, with phosphorus and with the lower level 30 left undoped. Again, the etch rates of the two oxide layers 30 and 38 would be sufficiently different to permit faster removal of the upper oxide layer 38 compared to other oxide-covered areas.

Finally, silicon nitride could be use in place of silicon dioxide for layer 38.

In any event, the metal interconnect 36 may then be routed directly over the contact 10' area.

In summary, the novel butting contact 10' of the invention uses the plug 32 to electrically interconnect one or more polysilicon layers (gate poly 22 and/or one or more load poly layers 28) with the doped silicon region 12. The butting contact 10' also contacts the upper-layer polysilicon segment 28 on the edge by using a special two step anisotropic etch cycle. By these means, the contact area is about one-half the size required for a conventional butting contact. It will thus be appreciated that the contact can be used to connect one, two, or several layers of polysilicon with a doped silicon region.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other MOS or bipolar fabrication technologies or processes or combinations thereof. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A reduced area butting contact structure for an integrated circuit for interconnecting by means of a conductive plug a doped region of a semi-conductor material with at least one polycrystalline segment selected from the group consisting of a first-layer polysilicon segment and at least one upper-layer polysilicon segment, wherein
    (a) said first-layer polysilicon segment is separated from said doped region by a thin oxide layer and said at least one upper-layer polysilicon segment is positioned between and bordered above and below by upper layers of insulating material;
    (b) said conductive plug comprises a conductive material confined in and substantially filling a contact hole;
    (c) said contact hole is positioned over a portion of said doped region and portions of said first-layer polysilicon segment and a portion of said at least one upper-layer polysilicon segment which are contacted; and (d) said contact hole extends from the surface of the uppermost said upper layer of insulating material through said portions of said at least one upper-layer polysilicon segment which are contacted and said upper layers of insulating material down to and terminating on said portion of said doped region to expose said portion of said first-layer polysilicon segment, said at least one upper-layer polysilicon segment being contacted along an exposed edge only, which edge is coincident with said contact hole.

2. The contact structure of claim 1 wherein said doped region is interconnected with both said first-layer polysilicon segment and said at least one upper-layer polysilicon segment.

3. The contact structure of claim 1 wherein said thin oxide layer is used as a gate dielectric elsewhere in said integrated circuit.

4. The contact structure of claim 1 wherein said plug comprises a conductive material which can be conformally deposited.

5. The contact structure of claim 4 wherein said conductive material is selected from the group consisting of tungsten and doped polysilicon of one conductivity type.

6. The contact structure of claim 5 wherein said doped region is doped N+ and said plug comprises N+ doped polysilicon.

7. The contact structure of claim 5 wherein said doped region is doped P+ and said plug comprises P+ doped polysilicon.

8. The contact structure of claim 1 wherein said at least one upper-layer polysilicon segment includes at least one polysilicon segment doped so as to form a high resistance load device.

9. The contact structure of claim 1 wherein said at least one upper-layer polysilicon segment includes at least one polysilicon segment doped so as to form a low resistance interconnect.

10. The contact structure of claim 1 further provided with an insulating plug cover to prevent shorting to an overlying metal interconnect.

11. The contact structure of claim 10 wherein said insulating plug cover comprises a material selected from the group consisting of silicon dioxide and silicon nitride.

12. A reduced area butting contact structure for an integrated circuit for interconnecting a doped region of a semiconductor material with a first-layer polysilicon segment thereover by means of a conductive plug, said first-layer polysilicon segment being separated from said doped region by a thin oxide layer and being covered by an upper layer of insulating material, wherein said conductive plug comprises a conductive material confined in and substantially filling a contact hole, and wherein said contact hole extends from the surface of said upper insulating layer down to and terminating on a portion of said doped region to expose a portion of said first layer polysilicon segment, said first-layer polysilicon segment being contacted along an exposed edge only, which edge is coincident with said contact hole, said contact structure further provided with an insulating plug cover to prevent shorting of an overlying metal interconnect.

13. The contact structure of claim 12 wherein said plug comprises a conductive material which can be conformally deposited.

14. The contact structure of claim 14 wherein said conductive material is selected from a group consisting of tungsten and doped polysilicon of one conductivity type.

15. The contact structure of claim 15 wherein said doped region is doped N+ and said plug comprises N+ doped polysilicon.

16. The contact structure of claim 15 wherein said doped region is doped P+ and said plug comprises P+ doped polysilicon.

17. The contact structure of claim 12 wherein said insulating plug cover comprises a material selected from the group consisting of silicon dioxide and silicon nitride.

18. A reduced area butting contact structure for an integrated circuit for interconnecting a doped region of a semiconductor material with at least one upper-layer polysilicon segment by means of a conductive plug, wherein (a) said at least one upper-layer polysilicon segment is positioned between and bordered above and below by layers of insulating material;

(b) said conductive plug comprises a conductive material confined in and substantially filling a contact hole;

(c) said contact hole is positioned over a portion of said doped region and portions of any of said at least one upper-layer polysilicon segment which are contacted; and (d) said contact hole extends from the surface of the uppermost said layer of insulating material through said portions of said at least one upper-layer polysilicon segment which are contacted and said upper layers of insulating material down to and terminating on said portion of said doped region, said at least one upper-layer polysilicon segment being contacted along an exposed edge only, which edge is coincident with said contact hole.

19. The contact structure of claim 19 wherein said plug comprises a conductive material which can be conformally deposited.

20. The contact structure of claim 20 wherein said conductive material is selected from the group consisting of tungsten and doped polysilicon of one conductivity type.

21. The contact structure of claim 21 wherein said doped region is doped N+ and said plug comprises N+ doped polysilicon.

22. The contact structure of claim 21 wherein said doped region is doped P+ and said plug comprises P+ doped polysilicon.

23. The contact structure of claim 19 wherein said at least one upper-layer polysilicon segment includes at least one polysilicon segment doped so as to form a high resistance load device.

24. The contact structure of claim 19 wherein said at least one upper-layer polysilicon segment includes at least one polysilicon segment doped so as to form a low resistance interconnect.

25. The contact structure of claim 19 further provided with an insulating plug cover to prevent shorting to an overlying metal interconnect.

26. The contact structure of claim 26 wherein said insulating plug cover comprises a material selected from a group consisting of silicon dioxide and silicon nitride.

27. In a four-transistor static RAM cell, a reduced area butting contact structure for interconnecting a doped region of a semiconductor material with a first-layer polysilicon segment and at least one upper-layer polysilicon segment by means of a conductive plug, wherein
  (a) said first-layer polysilicon segment is separated from said doped region by a thin oxide layer used as a gate dielectric elsewhere in said cell and said at least one upper-layer polysilicon segment is positioned between and bordered above and below by upper layers of insulating material;
  (b) said conductive plug consists essentially of a conductive material selected from the group consisting of tungsten and doped polysilicon confined in and substantially filling a contact hole;
  (c) said contact hole is positioned over a portion of said doped region and portions of said first-layer polysilicon segment and portions of said at least one upper-layer polysilicon segment which are contacted; and
  (d) said contact hole extends from the surface of the uppermost said upper layer of insulating material through said portions of said at least one upper-layer polysilicon segment which are contacted and said upper layers of insulating material down to and terminating on said portion of said doped region to expose said portion of said first-layer polysilicon segment, said at least one upper-layer polysilicon segment being contacted along an exposed edge only, which edge is coincident with said contact hole.

28. The contact structure of claim 27 wherein said doped region is doped N+ and said plug comprises N+ doped polysilicon.

29. The contact structure of claim 27 wherein said doped region is doped P+ and said plug comprises P+ doped polysilicon.

30. The contact structure of claim 27 wherein said at least one upper-layer layer polysilicon segment includes at least one polysilicon segment doped so as to form a high resistance load device.

31. The contact structure of claim 27 wherein said at least one upper-layer polysilicon segment includes at least one polysilicon segment doped so as to form a low resistance interconnect.

32. The contact structure of claim 27 further provided with an insulating plug cover to prevent shorting to an overlying metal interconnect.

33. The contact structure of claim 32 wherein said insulating plug cover comprises a material selected from the group consisting of silicon dioxide and silicon nitride.

* * * * *